(12) United States Patent
Ferru

(10) Patent No.: US 8,183,574 B2
(45) Date of Patent: May 22, 2012

(54) THERMAL ISOLATION OF ELECTRONIC DEVICES IN SUBMOUNT USED FOR LEDS LIGHTING APPLICATIONS

(75) Inventor: Gilles Ferru, Cairon (FR)

(73) Assignee: NXP B.V., Eindhoven (NL)

( * ) Notice: Subject to any disclaimer, the term of this patent is extended or adjusted under 35 U.S.C. 154(b) by 359 days.

(21) Appl. No.: 12/297,267

(22) PCT Filed: Apr. 17, 2007

(86) PCT No.: PCT/IB2007/051362
§ 371 (c)(1),
(2), (4) Date: Oct. 15, 2008

(87) PCT Pub. No.: WO2007/122548
PCT Pub. Date: Nov. 1, 2007

(65) Prior Publication Data
US 2009/0279218 A1    Nov. 12, 2009

(30) Foreign Application Priority Data

Apr. 20, 2006   (EP) ..................... 06300386

(51) Int. Cl.
*H01L 27/15* (2006.01)
(52) U.S. Cl. .......... 257/79; 438/353; 438/355; 438/404; 438/405; 257/717; 257/718; 257/725; 257/728; 257/510
(58) Field of Classification Search .................. 438/353, 438/355, 404, 405; 257/717, 718, 725, 728, 257/510
See application file for complete search history.

(56) References Cited

U.S. PATENT DOCUMENTS

| | | | | |
|---|---|---|---|---|
| 4,598,167 A * | 7/1986 | Ushifusa et al. | ............... | 174/258 |
| 5,003,357 A * | 3/1991 | Kim et al. | ........................ | 257/98 |
| 5,659,458 A * | 8/1997 | Patchen | ........................ | 361/704 |
| 5,660,917 A * | 8/1997 | Fujimori et al. | ........... | 428/195.1 |
| 5,735,606 A * | 4/1998 | Tani et al. | ...................... | 374/185 |
| 5,844,205 A * | 12/1998 | White et al. | ................... | 219/390 |
| 5,914,488 A * | 6/1999 | Sone | ......................... | 250/338.1 |
| 5,933,324 A * | 8/1999 | Barrett | ........................ | 361/703 |
| 6,039,471 A * | 3/2000 | Wyland | ........................... | 374/43 |
| 6,087,632 A * | 7/2000 | Mizosaki et al. | ............. | 219/390 |
| 6,097,005 A * | 8/2000 | Akimoto | .................... | 219/444.1 |
| 6,190,985 B1 * | 2/2001 | Buynoski | ...................... | 438/311 |
| 6,198,635 B1 * | 3/2001 | Shenoy et al. | ................ | 361/760 |
| 6,262,480 B1 * | 7/2001 | Ferri et al. | ..................... | 257/706 |
| 6,373,348 B1 * | 4/2002 | Hagerup | ..................... | 333/81 A |
| 6,407,462 B1 * | 6/2002 | Banouvong et al. | .......... | 257/787 |
| 6,474,154 B2 * | 11/2002 | Kohmura et al. | ............... | 73/202 |
| 6,477,054 B1 * | 11/2002 | Hagerup | ........................ | 361/720 |
| 6,608,379 B2 * | 8/2003 | Yeo et al. | ...................... | 257/706 |
| 6,696,643 B2 * | 2/2004 | Takano | ......................... | 174/520 |
| 6,822,325 B2 * | 11/2004 | Wong | ............................. | 257/717 |
| 6,837,059 B2 * | 1/2005 | Ueki et al. | ....................... | 62/3.7 |
| 7,148,554 B2 * | 12/2006 | Nah et al. | ...................... | 257/532 |
| 7,227,171 B2 * | 6/2007 | Bez et al. | .......................... | 257/3 |
| 7,281,326 B1 * | 10/2007 | Kwong et al. | .................. | 29/852 |
| 7,286,359 B2 * | 10/2007 | Khbeis et al. | ................. | 361/704 |
| 7,294,897 B2 * | 11/2007 | Akram et al. | ................. | 257/434 |
| 7,583,862 B2 * | 9/2009 | Tuttle et al. | .................. | 382/312 |

(Continued)

*Primary Examiner* — N Drew Richards
*Assistant Examiner* — Ankush k Singal

(57) ABSTRACT

The present invention relates to an electronic device for providing improved heat transporting capability for protecting heat sensitive electronics and a method for producing the same. The present invention also relates to uses of the electronic device for various applications such as in LED lamps for signalizing, signage, automative and illumination applications or a display apparatus or any combinations thereof.

29 Claims, 4 Drawing Sheets

U.S. PATENT DOCUMENTS

| | | | |
|---|---|---|---|
| 7,599,277 B1 * | 10/2009 | Kato et al. | 369/112.27 |
| 7,692,148 B2 * | 4/2010 | Lane et al. | 250/338.1 |
| 7,791,889 B2 * | 9/2010 | Belady et al. | 361/721 |
| 2002/0011802 A1 * | 1/2002 | Espiau et al. | 315/246 |
| 2002/0017346 A1 * | 2/2002 | Osada et al. | 148/679 |
| 2002/0162678 A1 * | 11/2002 | Takano | 174/52.1 |
| 2002/0190839 A1 * | 12/2002 | Padmanabhan et al. | 338/13 |
| 2003/0121902 A1 * | 7/2003 | Tanoue et al. | 219/444.1 |
| 2003/0161088 A1 * | 8/2003 | Migita | 361/234 |
| 2004/0021198 A1 * | 2/2004 | Wong | 257/516 |
| 2004/0147057 A1 * | 7/2004 | Benzel et al. | 438/54 |
| 2004/0233268 A1 * | 11/2004 | Miyachi et al. | 347/200 |
| 2005/0045901 A1 * | 3/2005 | Wall, Jr. | 257/99 |
| 2005/0074046 A1 | 4/2005 | Kasai | |
| 2005/0247432 A1 * | 11/2005 | Bhatti et al. | 165/80.3 |
| 2005/0254215 A1 * | 11/2005 | Khbeis et al. | 361/704 |
| 2005/0275051 A1 * | 12/2005 | Farnworth et al. | 257/433 |
| 2006/0006525 A1 * | 1/2006 | Mullen et al. | 257/712 |
| 2006/0017157 A1 * | 1/2006 | Yamamoto et al. | 257/728 |
| 2007/0120060 A1 * | 5/2007 | Lane et al. | 250/353 |

* cited by examiner

THERMAL ISOLATION OF ELECTRONIC DEVICES IN SUBMOUNT USED FOR LEDS LIGHTING APPLICATIONS

TECHNICAL FIELD

The present invention relates to an electronic device providing improved heat transporting capability for protecting heat sensitive electronics and a method for producing the same. The present invention also relates to uses of the electronic device for various applications.

BACKGROUND OF THE INVENTION

Electronic devices comprise a growing number of electronic components, some of which generate large amount of excess heat and some of which are more sensitive to heat, causing the electronics to malfunction, sometimes temporary and sometimes permanently.

This has become a growing concern in the electronics industry, especially with the ongoing development of smaller and smaller electronic devices concurrent with the increasing number of electronic elements on a given area. Consequently, it has become increasingly difficult to eliminate unwanted influence between these components, such as for instance due to heat emission. In the process of finding a remedy to this, it has therefore been attempted to designigning these devices so that heat emitting components and other components are separated from one another.

For instance, one specific field in which this has become a tangible problem is within large-volume application of high-brightness Light Emitting Diodes (LED) that are well established for signalling and signage. These diodes are expected to replace conventional lamps in lighting applications within a few years.

Electronic devices are today commonly referred to as being chip-based. A known principle to achieve a compact multi-chip module is to use naked LED chips mounted on a common substrate, such as one fabricated in silicon. In this substrate, more and more electronic components are integrated, for instance active components such as diodes and transistors as wells as passive components such as resistors, capacitors and inductors. These components set the color and flux setting of the light output of the multi-chip module.

Due to the light emitting characteristics of the LEDs, a large amount, around 80%, of the input power is dissipated in heat. As a consequence, this heat elevates the junction temperature of the LED and decrease the lifetime and the efficiency of it. Furthermore, more and more frequently it occurs that the LED junction temperature is rising at levels higher than 150° C., sometimes even as high as 185° C. In this range of temperature, the functionality of the electronic devices is strongly affected and impact the good light control of a Multi-chip module.

In order to maintain a good light control of such lighting modules, it is essential that the temperature of at the LED junctions is maintained below a certain threshold value. Hence, it is desirable for finding ways to increase the heat dissipation and protect the electronic devices from the excess heat.

US Patent Application 2005/0074046 discloses a heat generating diode chip, such as a laser diode, being separated from electrical circuitry by a heat sink and a thermal insulation layer so that heat generated by the light emitting element is not transmitted to the driver chip.

However, a number of drawbacks are associated with the devices of the prior art. It is therefore requested an alternative, convenient solution to shielding off heat sensitive components integrated in a substrate.

SUMMARY OF THE INVENTION

In view of the above, an object of the invention is to solve or at least reduce the problems discussed above. In particular, an object is to achieve an improved thermal insulation of electronic devices, especially in submounts for LED lighting applications.

The above objects, are obtained according to a first aspect of the present invention by an electronic device comprising a substrate, heat emitting electronics and other electronics. The electronic device further comprising means for thermal insulation and means for heat dissipation. The heat emitting electronics and the other electronics are arranged on the substrate. The means for thermal insulation are arranged in the substrate to prevent heat dissipation from the heat emitting electronics along a first direction towards the other electronics, and the means for heat dissipation are arranged in the substrate to dissipate heat through the substrate along a second direction different than that of the first direction. Hence, it is accomplished a device in which thermal barriers and highly heat conductive paths in silicon submounts are arranged in order to dissipate heat and, as an advantage, to avoid excessive heating of electronic devices which are integrated in a submount.

Hence, as an advantage, since the means for thermal insulation and means for heat dissipation are integrated in the substrate it occupies little space and provides improved control of the heat dissipation by leading through the substrate in any wanted direction as given by the provision of the means for heat dissipation. Hence, by conduction, heat can be directed or lead to the back side of the substrate without disturbing the integrated devices at the front side of the substrate.

Further, as an effect from the heat dissipation an increase of the current flowing through the LEDS will occur, and subsequently, as an advantage it results in an increase in light emitting efficiency from the light emitting devices.

The substrate of the electronic device may preferably be heat conductive, with the advantage of allowing for heat to be transported away from the heat generating source.

The substrate may furthermore be fabricated in silicon, allowing for the employment of its advantageous semi-conducting properties.

The substrate may further comprise a material having thermal conductivity in the range between 100 W/K.m and 200 W/K.m, or even more preferably 140 W/K.m. Hereby, as an advantage, providing a significantly greater thermal conductivity with respect to that of the substrate itself.

According to one embodiment of the invention, the heat emitting electronics may comprise a light emitting device (LED), preferably a high power LED. Although excess heat is generated in many sorts of electronic components, it may be especially advantageous to be able to provide an efficient heat dissipative effect in applications of light emitting devices, and especially such which are driven with high power.

Due to the nature of the heat sensitivity of the other electronics, these electronics may benefit even more advantageously from the shielding of heat emitted from certain components depending on its characteristics. The other electronics may thus for instance comprise active components such as diodes and/or transistors or passive components such as resistors, capacitors, inductors, or any combinations thereof.

According to one embodiment of the invention, the other electronics are connected to and arranged to control characteristics of the heat emitting electronics such as color and/or flux settings of light output of LEDs. Hence, according to the invention, it is achieved the advantage of providing light emitting devices having improved appearance and performance.

According to another embodiment of the present invention, the means for thermal insulation comprise a material having thermal conductivity equal to or less than 100 W/K.m, preferably equal to or less than 50 W/K.m, or more preferably equal to or less than 10 W/K.m, or even more preferably 2 W/K.m. In essence, an improved protection from heat is advantageously achieved in having a material with relatively lower thermal conductivity than the rest of the surrounding substrate. This effect is especially advantageously pronounced having the thermal insulating material silicon oxide.

According to a further embodiment of the present invention, the means for heat dissipation comprise a material having thermal conductivity equal to or greater than 200 W/K.m, preferably equal to or greater than 300 W/K.m, even more preferably equal to or greater than 400 W/K.m. Hereby, it is advantageously achieved an improved protection of the heat sensitive electronics due to improved heat dissipating capabilities. This effect is especially advantageously pronounced having a material of high thermal conductivity such as a metal, preferably copper.

Hence, as an advantage the different thermal conductivities of materials are used to protect electronic devices integrated in a substrate from the heat.

According to yet another embodiment of the present invention, the means for thermal insulation occupies a trench in the substrate. As an advantage, employing a trench provides an efficient and effective barrier for the purposes of heat shielding which is also easy to manufacture. Advantageously, the trench may extend laterally with respect to the first direction, preferably to a depth of at least halfway through the substrate.

According to yet a further embodiment of the present invention, the means for heat dissipation comprises substrate through vias filled with a heat dissipative material. Hence, as an advantage, heat may be efficiently be dissipated through these channels through the substrate.

Additionally, according to yet another embodiment of the present invention, the other electronics may further comprise at least a first zener diode for protecting the heat emitting electronics from electrostatic discharges (ESDs).

According to another embodiment, the electronic device is a chip-module, preferably a multi-chip module, which has as an advantage of allowing for a wide variety of configurations of electronic components.

In other words, the invention according to one preferred embodiment is realized by a substrate comprising electronic devices which are isolated from heat generated by for instance a LED with a deep trench filled with silicon oxide. As the thermal conductivity of the silicon oxide is very low, it protects the components from the heat emitted by the LED. Substrate through vias filled with copper act as a heat pipe and facilitate the heat dissipation.

The above objects, are obtained according to a second aspect of the present invention by a method for fabricating an electronic device comprising a substrate, heat emitting electronics and other electronics. The electronic device further comprising means for thermal insulation and means for heat dissipation, the means being arranged to protect the other electronics from the heat emitting electronics. The method comprises the steps of:
  integrating the electronics with the substrate,
  completing diffusion, isolation and connections of the devices, and
  patterning windows by lithography in the substrate.

According to one embodiment of the invention, the method further comprises the steps of:
  etching trenches in the windows,
  oxidating the substrate,
  depositing in the trenches of a material having heat conductive characteristics greater than that of the substrate,
  depositing and patterning windows in a dielectric on a surface of the substrate essentially opposing the first surface,
  dry etching second trenches in windows from second surface towards first surface,
  depositing oxide in the second trenches,
  depositing a seed layer in the second trenches,
  growing electroplated copper in the second trenches, and
  soldering of dies on second surface of the substrate.

According to another embodiment of the present invention, the method further comprises the steps of:
  depositing and patterning windows in a non-oxidable dielectric on a first surface of a substrate,
  dry etching for removal of the TEOS outside the trenches, while leaving TEOS deposited in the trenches,
  performing Chemical Mechanical Polishing of second surface of the substrate to remove unwanted copper residue, and
  depositing metal, preferably TiNiAg (titanium, nickel and silver), on the second surface of the substrate.

According to a further embodiment of the present invention, the material with greater heat conducting characteristics comprises Tetraethooxysilane (TEOS) oxide.

It should be mentioned that according to a preferred embodiment, the dielectric may be non-oxidizable.

According to another preferred embodiment, the step of oxide deposition in the secondary trenches comprises Plasma Enhanced Chemical vapour deposition (PECVD).

According to yet another embodiment of the present invention, the seed layer is deposited to comprise titanium at a thickness of between 400 and 600 Ångstrom and copper at a thickness of between 4000 and 6000 Ångstrom.

Preferably the etching of trenches may extend to a depth ranging between 30 and 50 mm. It should also be noted that the step of etching trenches preferably may comprise dry etching.

The above objects, are obtained according to a third aspect of the present invention by a use of an electronic device according to embodiments corresponding to any of the previously mentioned embodiments in LED lamps for signalizing, signage, automative and illumination applications or a display apparatus or any combinations thereof.

Practical applications of the invention include use in a wide range of LED lamps for signalizing, signage, automotive and other illumination applications where high power LEDs are used.

Other objects, features and advantages of the present invention will appear from the following detailed disclosure, from the attached dependent claims as well as from the drawings.

Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

BRIEF DESCRIPTION OF THE FIGURES

The above, as well as additional objects, features and advantages of the present invention, will be better understood through the following illustrative and non-limiting detailed description of preferred embodiments of the present invention, with reference to the appended drawings, where the same reference numerals will be used for similar elements, wherein.

DETAILED DESCRIPTION OF THE INVENTION

Figure 1:
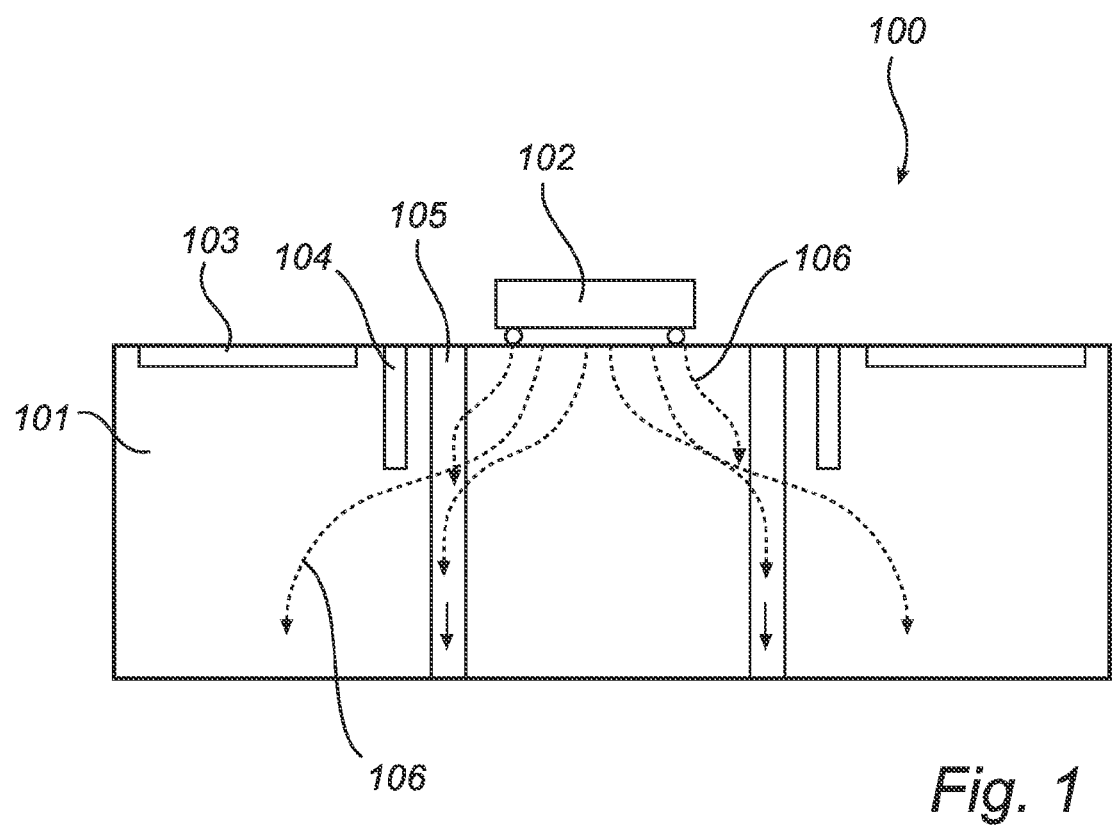
FIG. 1 shows conceptually a view of an electronic device according to the present invention.
Figure 2A:
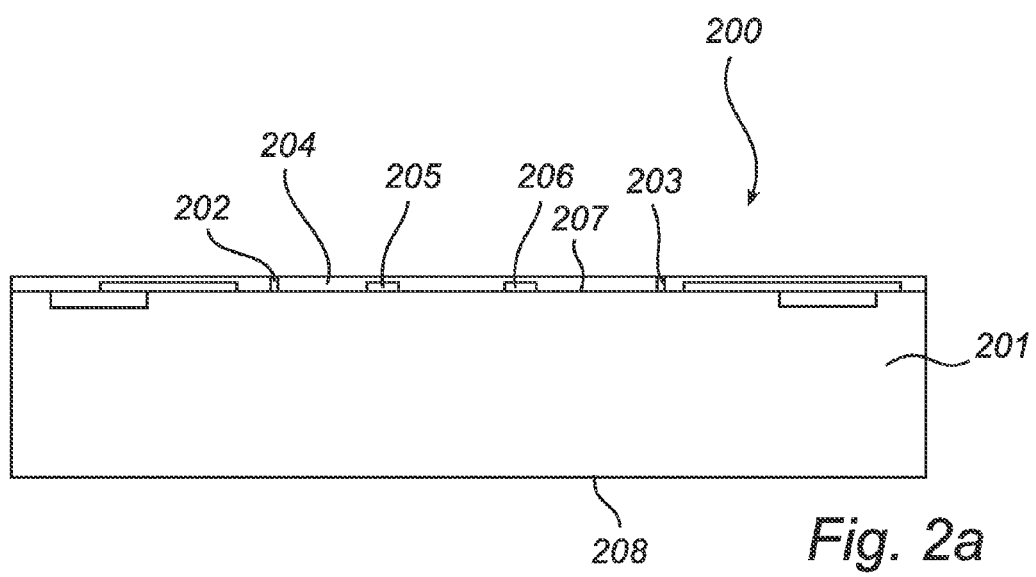
FIG. 2 sections a) to h) indicates schematically the steps comprised in a method of producing an electronic device as described in FIG. 1.
Figure 2B:
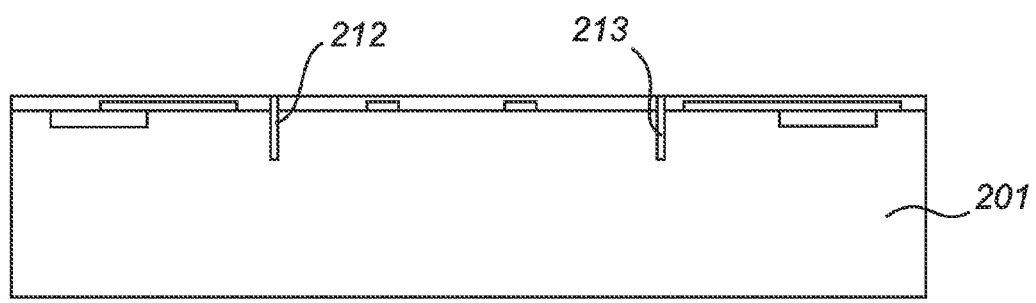
Figure 2C:
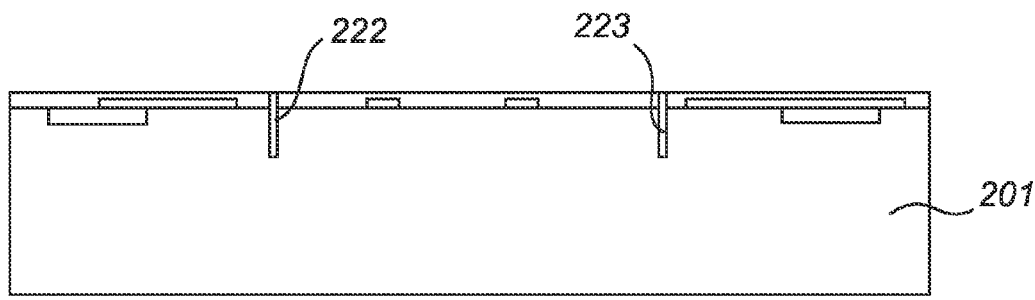
Figure 2D:
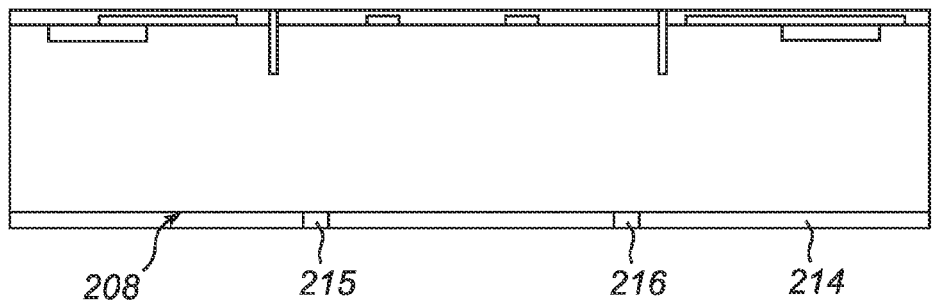
Figure 2E:
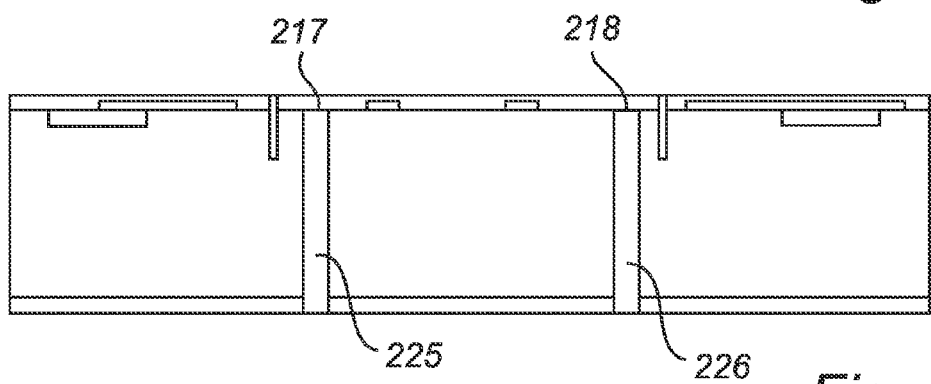
Figure 2F:
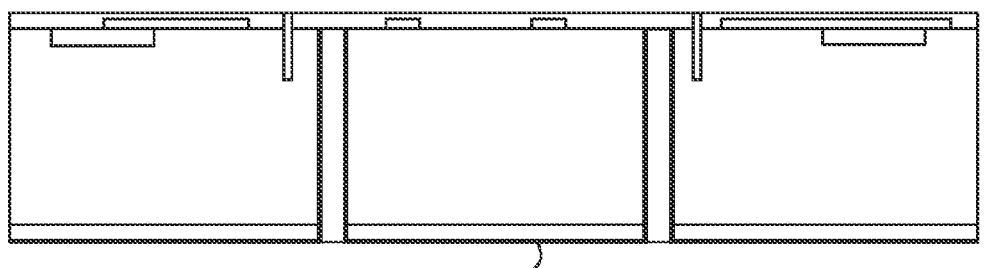
Figure 2G:
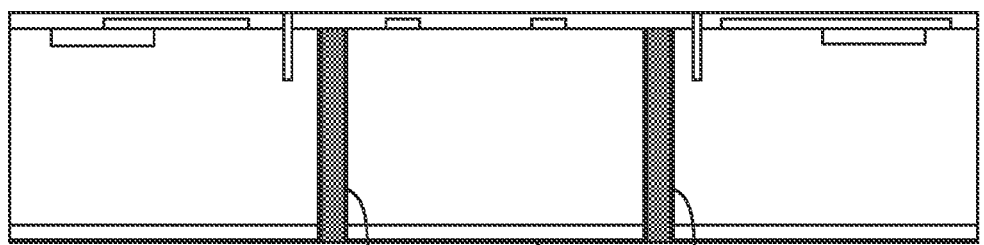
Figure 2H:
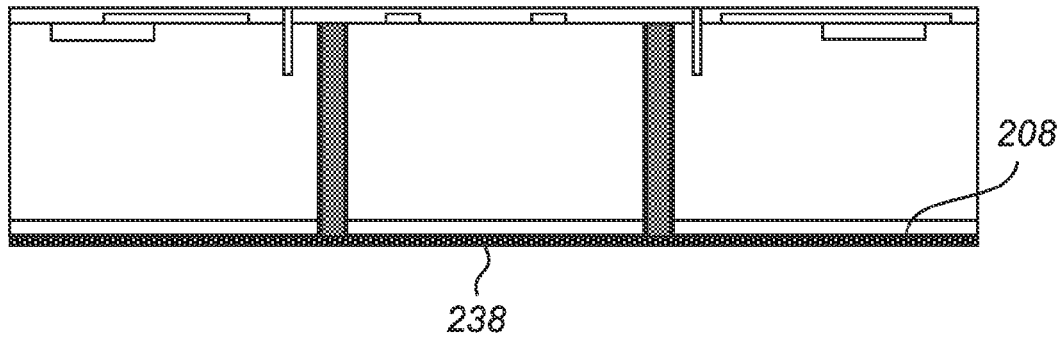

FIG. 1 shows an electronic device 100 comprising a substrate 101 having surface mounted heat emitting electronics 102, other electronics 103, means for thermal insulation 104 and means for heat dissipation 105. Also shown in the figure are arrows 106, indicating the direction of heat dissipation from the heat emitting electronics 102. FIG. 1 illustrates the principle of increasing heat dissipation and thereby protecting electronic devices from the heat.

FIG. 2 illustrates schematically the steps a) to h) over the process of constructing an electronic device according to one aspect of the invention. Sections a) to h) of FIG. 2 depicts an electronic device 200 in which the invention is implemented, although various other embodiments are possible as known to a person skilled in the art. The device 200 comprises a substrate 201 of a semiconductor material of type N or P. Typically, the substrate 201 have been prepared using standard processes such as doping, diffusion, etching or thin film deposition. The substrate is shown having a first 207 and a second 208 surface. In section a) of FIG. 2 it is illustrated how windows 202 and 203 have been deposited and patterned in a non oxidizable dielectric 204 on the first surface 207 of the substract 201. Connectors 205 and 206 for connecting with heat generating electronics have been added directly onto the surface 207 using metallisation. In section b) of FIG. 2, trenches 212 and 213 have been dry etched to a depth of approximately 30-50 μm inside the windows 202 and 203.

After the etching of these trenches 212 and 213, the surface 207 is oxidated and Tetraethooxysilane (TEOS) is deposited to fill the trenches as indicated with numerals 222 and 223 in section c) of FIG. 2. Hence, using a material with low heat conductivity, effective heat barriers have been created. A dry etch then removes unwanted TEOS outside the trenches, while the TEOS deposited in the trenches remains.

Section d) of FIG. 2 shows windows 215 and 216 which have deposited and patterned in a non oxidizable dielectric 214 on the second surface 208 of the substrate.

Section e) of FIG. 2 shows how a dry etch inside the windows 205 and 206 has created trenches 225 and 226 through to the front side 217 and 218 of the dielectric. PECVD oxide is then deposited in these trenches.

In the same trenches 225 and 226, a seed layer 209 of a thickness ranging between 500 Ångstrom of Ti and 5000 Ångstrom of copper is deposited as illustrated in section f) of FIG. 2. Section g) of FIG. 2 illustrates how trenches have been filled with Copper 235 and 236 using an electroplate process.

Furthermore, it is also shown in section g) of FIG. 2 how a Chemical Mechanical Polishing process has removed copper residue from the second surface 228.

Finally, section h) of FIG. 2 illustrates how TiNiAg (Titanium, Nickel, Silver) 238 has been deposited on the second surface 208 of the substrate 201 in order to facilitate soldering of dies as a heatsink.

The invention claimed is:

1. An electronic device comprising a substrate, heat emitting electronics and other electronics, a thermal insulation element and a heat dissipation element, wherein the heat emitting electronics and other electronics are arranged on the substrate and the thermal insulation element is arranged in the substrate to prevent heat dissipation from the heat emitting electronics along a first direction towards the other electronics, characterized in that the heat dissipation element is arranged in the substrate in a second direction different than that of the first direction and arranged offset from the heat emitting electronics along the first direction to dissipate heat traversing through the substrate along the second direction.

2. The electronic device according to claim 1, wherein the substrate is heat conductive.

3. The electronic device according to claim 1, wherein the substrate fabricated in silicon.

4. The electronic device according to claim 1, wherein the substrate comprises a material having thermal conductivity in the range between about 100 W/K.m and 200 W/K.m.

5. The electronic device according to claim 1, wherein the heat emitting electronics comprises a light emitting device (LED).

6. The electronic device according to claim 1, wherein the other electronics comprises at least one of integrated electronic components, active components, diodes, transistors, passive components, resistors, capacitors, and inductors.

7. The electronic device according to claim 1, wherein the other electronics are connected to and arranged to control characteristics of the heat emitting electronics including at least one of color and flux settings of light output of LEDs.

8. The electronic device according to claim 1, wherein the thermal insulation element comprises a material having thermal conductivity equal to or less than 100 W/K.m.

9. The electronic device according to claim 1, wherein the heat dissipation element comprises a material having thermal conductivity equal to or greater than 200 W/K.m.

10. The electronic device according to claim 1, wherein the thermal insulation element occupies a trench in the substrate.

11. The electronic device according to claim 1, wherein the heat dissipation element comprises substrate through vias filled with a heat dissipative material.

12. The electronic device according to claim 1, wherein the other electronics further comprises at least a first zener diode for protecting the heat emitting electronics from electrostatic discharges (ESDs).

13. The electronic device according to claim 1, wherein the device is a multi-chip module.

14. The electronic device according to claim 1, wherein the heat dissipation element is located laterally between the heat emitting electronics and the other electronics and configured to dissipate heat through the substrate along the second direction by redirecting heat, traveling laterally through the substrate along the first direction towards the other electronics, along the second direction.

15. The electronic device according to claim 1, wherein
the thermal insulation element includes a trench extending partially into the substrate, and
the heat dissipation element is configured to intercept heat that is traveling laterally through the substrate and that would reach the other electronics through a portion of the substrate extending around the trench, absent the heat dissipation element, and to redirect the intercepted heat along the second direction.

16. The electronic device according to claim 1, wherein the device is a chip-module.

17. The electronic device according to claim 1, wherein the thermal insulation element comprises at least one of a material having thermal conductivity equal to or less than 2 W/K.m.

18. The electronic device according to claim 1, wherein the heat dissipation element comprises a material having thermal conductivity that is at least 400 W/K.m.

19. The electronic device according to claim 8, wherein the material is silicon oxide.

20. The electronic device according to claim 9, wherein the heat dissipation element comprises a material including a metal.

21. The electronic device according to claim 10, wherein the trench extends laterally with respect to the first direction, at a depth of at least half way through the substrate.

22. A method for fabricating an electronic device comprising a substrate, heat emitting electronics and other electronics, a thermal insulation element and a heat dissipation element arranged to protect the other electronics from the heat emitting electronics, the method comprising the steps of:
    integrating the electronics with the substrate,
    completing diffusion, isolation and connections of the devices,
    patterning windows by lithography in the substrate,
    etching trenches in the windows,
    oxidating the substrate,
    depositing in the trenches of a material having heat conductive characteristics greater than that of the substrate,
    depositing and patterning windows in a dielectric on a surface of the substrate essentially opposing a first surface of the substrate,
    dry etching second trenches in windows from a second surface of the substrate towards the first surface,
    depositing oxide in the second trenches,
    depositing a seed layer in the second trenches,
    growing electroplated copper in the second trenches, and
    soldering of dies on the second surface of the substrate.

23. The method according to claim 22, wherein the method furthermore comprises the steps of:
    depositing and patterning windows in a non-oxidable dielectric on the first surface of the substrate,
    dry etching for removal of the material having heat conductive characteristics outside the trenches, while leaving the material having heat conductive characteristics deposited in the trenches,
    performing Chemical Mechanical Polishing of the second surface of the substrate to remove unwanted copper residue, and
    depositing metal on the second surface of the substrate.

24. The method according to claim 22, wherein the material having heat conductive characteristics greater than that of the substrate comprises Tetraethooxysilane (TEOS) oxide.

25. The method according to claim 22, wherein the seed layer is deposited to comprise titanium at a thickness of between 400 and 600 Ångstroms (Å) and copper at a thickness of between 4000 and 6000 . Ångstroms (Å).

26. The method according to claim 22, wherein the step of etching trenches comprises dry etching.

27. The method according to claim 22, wherein the step of etching trenches comprises etching to a depth ranging between 30 and 50 μm.

28. Use of an electronic device according to claim 22, in LED lamps for signalizing, signage, automotive and illumination applications or a display apparatus or any combinations thereof.

29. The method according to claim 22, further including the steps of:
    depositing and patterning windows in a dielectric on the first surface of the substrate,
    dry etching for removal of the material having heat conductive characteristics outside the trenches, while leaving the material having heat conductive characteristics deposited in the trenches,
    performing Chemical Mechanical Polishing of the second surface of the substrate to remove unwanted residue, and
    depositing metal, including TiNiAg (titanium, nickel and silver), on the second surface of the substrate.

* * * * *